United States Patent
Kamiya et al.

(10) Patent No.: US 9,250,521 B2
(45) Date of Patent: Feb. 2, 2016

(54) LITHOGRAPHIC PRINTING PLATE PRECURSOR AND A METHOD FOR MAKING A PRINTING PLATE

(71) Applicants: Masamichi Kamiya, Ota (JP); Yasuhiro Asawa, Oata (JP); Yasushi Miyamoto, Gunma-ken (JP); Maru Aburano, Gunma-ken (JP); Eiji Hayakawa, Utsunomiya (JP)

(72) Inventors: Masamichi Kamiya, Ota (JP); Yasuhiro Asawa, Oata (JP); Yasushi Miyamoto, Gunma-ken (JP); Maru Aburano, Gunma-ken (JP); Eiji Hayakawa, Utsunomiya (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/350,462

(22) PCT Filed: Oct. 30, 2012

(86) PCT No.: PCT/JP2012/078058
§ 371 (c)(1),
(2) Date: Apr. 8, 2014

(87) PCT Pub. No.: WO2013/069508
PCT Pub. Date: May 16, 2013

(65) Prior Publication Data
US 2014/0255848 A1 Sep. 11, 2014

(30) Foreign Application Priority Data
Nov. 10, 2011 (JP) .................................. 2011-246507

(51) Int. Cl.
G03F 7/00 (2006.01)
G03F 7/038 (2006.01)
G03F 7/095 (2006.01)
B41C 1/10 (2006.01)
G03F 7/32 (2006.01)

(52) U.S. Cl.
CPC ............ *G03F 7/0387* (2013.01); *B41C 1/1008* (2013.01); *B41C 1/1016* (2013.01); *G03F 7/095* (2013.01); *B41C 2210/02* (2013.01); *B41C 2210/06* (2013.01); *B41C 2210/14* (2013.01); *B41C 2210/266* (2013.01); *G03F 7/322* (2013.01)

(58) Field of Classification Search
CPC ........................... G03F 7/035; B41C 2210/02
See application file for complete search history.

(56) References Cited

U.S. PATENT DOCUMENTS

| | | | |
|---|---|---|---|
| 6,110,640 A | 8/2000 | Kawamura et al. | |
| 6,132,931 A | 10/2000 | Kawamura et al. | |
| 7,399,576 B1 * | 7/2008 | Levanon | 430/302 |
| 2009/0208869 A1 | 8/2009 | Kamiya et al. | |
| 2010/0081771 A1 * | 4/2010 | Taguchi | B41C 1/1008 525/418 |
| 2010/0124721 A1 | 5/2010 | Kitson et al. | |

FOREIGN PATENT DOCUMENTS

| | | |
|---|---|---|
| JP | 63-287948 | 11/1988 |
| JP | 2000-003032 | 1/2000 |
| JP | 2000-003040 | 1/2000 |
| JP | 2011-158716 | 8/2011 |
| JP | 2011-197308 | 10/2011 |

* cited by examiner

Primary Examiner — Chanceity Robinson
(74) Attorney, Agent, or Firm — J. Lanny Tucker

(57) ABSTRACT

A positive-working lithographic printing plate precursor exhibits satisfactory developability and has long print run length, satisfactory scratch resistance, and exhibits improved ink receptivity. This precursor has an image forming layer comprising a water-insoluble and alkali-soluble or alkali-dispersible resin. The image forming layer comprises at least a lower layer and an upper layer. A resin in at least one of the lower layer and the upper layer is a polyurethane including a recurring unit comprising a substituent having an acidic hydrogen atom and a recurring unit represented by the following formula:

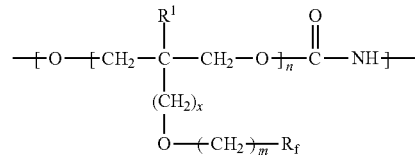

wherein $R_f$ is an alkyl or polyether group in which at least 50% of hydrogen atoms have been fluorinated, $R^1$ is a hydrogen atom, or a substituted or non-substituted alkyl group, m is 0 or 1 to 10, n is 1 to 30, and x is 1 to 4.

16 Claims, No Drawings

LITHOGRAPHIC PRINTING PLATE PRECURSOR AND A METHOD FOR MAKING A PRINTING PLATE

TECHNICAL FIELD

The present invention relates to a lithographic printing plate precursor, and particularly to an infrared-sensitive or heat-sensitive lithographic printing plate precursor which is used as a so-called computer-to-plate (CTP) plate capable of directly recording images by irradiation with infrared rays from a solid laser or a semiconductor laser corresponding to digital signals, and a method for forming a lithographic printing plate.

BACKGROUND ART

With the progress of computer image processing techniques, there has recently been developed a method in which images can be directly written on a photosensitive layer by light irradiation corresponding to digital signals. Thus, an intense interest has been shown toward a computer-to-plate (CTP) system in which images are directly formed on a photosensitive lithographic printing plate precursor without outputting onto a silver salt mask film, by employing the method. The CTP system, which uses a high-output laser having a maximum intensity within a near infrared or infrared range as a light source for light irradiation, has the following advantages: images having high resolution can be obtained by exposure within a short time and the photosensitive lithographic printing plate used in the system can be handled in daylight. Regarding solid and semiconductor lasers capable of emitting infrared ray having a wavelength of 760 to 1,200 nm, a high-output and portable laser is available with ease.

By the way, as a lithographic printing plate precursor which can form images using solid laser or semiconductor laser, there has been proposed a lithographic printing plate precursor comprising a substrate, an image recording layer formed on the substrate, and a protective layer of the image recording layer so as to prevent scratching of the surface of the lithographic printing plate precursor.

For example, Japanese Unexamined Patent Publication (Kokai) No. 2004-157459 discloses a lithographic printing plate precursor comprising a lower layer comprising a water-insoluble and alkali-soluble polyurethane resin and an upper layer comprising a m,p-cresol novolac resin, and this lithographic printing plate precursor is excellent in print run length and press life. However, this lithographic printing plate precursor has a problem in that it has narrow development latitude in a developing solution having the pH of 12 or lower, and also the upper layer is peeled off during the development to form deposits on a developing tank, and thus there is room for improvement in its developing properties.

In order to solve these problems, the inventors of the present application have proposed, in the specification of Japanese Unexamined Patent Publication (Kokai) No. 2007-17913 description, a lithographic printing plate precursor comprising a substrate, a first image recording layer formed on the substrate, and a second image recording layer formed on the first image recording layer, wherein the first image recording layer a resin which is water-insoluble and alkali-soluble or alkali-dispersible in an aqueous alkali solution, and the second image recording layer comprises a polyurethane which includes a unit comprising a substituent having an acidic hydrogen atom.

The lithographic printing plate precursor proposed in the specification of Japanese Unexamined Patent Publication (Kokai) No. 2007-17913 exhibits satisfactory developability using a developing solution having the pH of 11 or lower, and also has long print run length and satisfactory scratch resistance. However, an improvement from the viewpoint of ink receptivity is required.

PRIOR ART

Patent Document 1: Japanese Unexamined Patent Publication (Kokai) No. 2004-157459
Patent Document 2: Japanese Unexamined Patent Publication (Kokai) No. 2007-17913

SUMMARY OF INVENTION

Problems to be Solved by the Invention

In light of these circumstances, an object of the present invention is to provide a lithographic printing plate precursor which exhibits satisfactory developability using a developing solution having the pH of 12 or lower, and also has long print run length and satisfactory scratch resistance and exhibits improved inking property.

Means for Solving the Problems

The present inventors have intensively studied and found that, when resin, which is water-insoluble and alkali-soluble or alkali-dispersible in an aqueous alkali solution, used in an image forming layer which comprises a polyurethane including a unit comprising a substituent having an acidic hydrogen atom and a unit of the following general formula (I), whereby, all of these problems can be solved, and thus the present invention has been completed.

That is, the present invention provides a positive-working lithographic printing plate precursor comprising a substrate having thereon an image forming layer comprising a resin, which is water-insoluble and alkali-soluble or alkali-dispersible in an aqueous alkali solution, wherein the image forming layer comprises at least a lower layer and an upper layer, and the resin of one of the lower layer and the upper layer, or both of the lower layer and the upper layer comprises a polyurethane including a unit comprising a substituent having an acidic hydrogen atom and a unit represented by the following general formula (I):

[Chemical Formula 1]

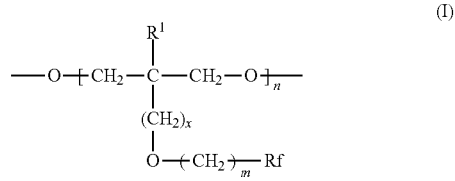

wherein
$R_f$ is an alkyl or polyether group in which at least 50% of hydrogen atoms have been fluorinated,
$R^1$ is a hydrogen atom, or a substituted or non-substituted alkyl group,
m is 0 or 1 to 10, n is 1 to 30, and
x is 1 to 4.

The present invention also provides a positive-working lithographic printing plate precursor comprising a substrate having thereon an image forming layer comprising a resin, which is water-insoluble and alkali-soluble or alkali-dispersible in an aqueous alkali solution, wherein the positive-working lithographic printing plate precursor further comprises a photothermal conversion material, and a resin, which is water-insoluble and alkali-soluble or alkali-dispersible in an aqueous alkali solution, comprises a polyurethane including a unit comprising a substituent having an acidic hydrogen atom and a unit represented by the following general formula (I):

[Chemical Formula 2]

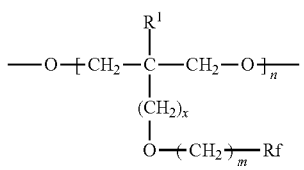

(I)

wherein
$R_f$ is a fluorinated alkyl or polyether group in which at least 50% of hydrogen atoms have been fluorinated,
$R^1$ is a hydrogen atom, or a substituted or non-substituted alkyl group,
m is 0 or 1 to 10, n is 1 to 30, and
x is 1 to 4.

The present invention also provides a method for producing a lithographic printing plate, which comprises the steps of: imagewisely exposing the above-mentioned positive-working lithographic printing plate precursor using infrared rays; and developing the exposed positive-working lithographic printing plate precursor with an alkali developing solution to remove the exposed area, and thus forming the image area and the non-image area.

Effects of the Invention

The lithographic printing plate precursor and the method for producing a lithographic printing plate of the present invention and have long print run length and satisfactory scratch resistance, and also exhibit wide development latitude even to a developing solution having the pH of 12 or lower and have satisfactory ink receptivity. A multilayer type lithographic printing plate precursor is less likely to form deposits during the development because lower and upper image forming layers constituting the image area are not peeled off by the developing solution.

BRIEF DESCRIPTION OF INVENTION

The present invention will be specifically described below. An aspect of the present invention is directed to a multilayer type lithographic printing plate precursor comprising a substrate and an image forming layer formed on the substrate, the image forming layer including at least two layers of a lower layer and an upper layer. As used herein, the "multilayer" type lithographic printing plate precursor means a lithographic printing plate precursor including an image forming layer of at least two layers (a lower layer and an upper layer) for providing images. The lower and upper layers are also referred to as image forming layers. The multilayer type image forming layer constituting the lithographic printing plate precursor of the present invention comprises a resin which is water-insoluble and alkali-soluble or alkali-dispersible in an aqueous alkali solution, and one of the lower layer and the upper layer, or both of the lower layer and the upper layer comprise(s) a polyurethane including a unit comprising a substituent having an acidic hydrogen atom and a unit of the following general formula (I). The polyurethane is also water-insoluble and alkali-soluble or alkali-dispersible in the aqueous alkali solution. The multilayer type lithographic printing plate precursor may include, in addition to the image forming layer of at least two layers, a non-image forming layer. The multilayer type lithographic printing plate precursor can include, for example, a separation layer between the lower layer and the upper layer.

The acidic hydrogen atom of the unit comprising a substituent having an acidic hydrogen atom of the polyurethane used in the present invention means those having an acid dissociation constant (pKa) of 7 or less in water, and can belong to an acidic functional group such as a carboxyl group, an —$SO_2NHCOO$— group, a —$CONHSO_2$— group, a —$CONHSO_2NH$— group, or an —$NHCONHSO_2$— group. It is particularly preferable that the acidic hydrogen atom is derived from a carboxyl group. Introduction of a substituent having an acidic hydrogen atom enables satisfactory developing properties in an alkali developing solution.

The polyurethane used in the present invention further includes a unit represented by the following general formula (I):

[Chemical Formula 3]

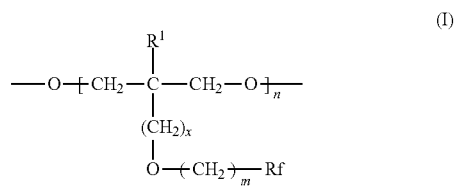

(I)

wherein
$R_f$ is a fluorinated alkyl or polyether group in which at least 50% of hydrogen atoms have been fluorinated,
$R^1$ is a hydrogen atom, or a substituted or non-substituted type alkyl group,
m is 0 or 1 to 10, n is 1 to 30, and
x is 1 to 4.

In the above formula, $R_f$ is an alkyl or polyether group having 1 to 20 carbon atoms, at least 50% of which has been fluorinated. A fluorination ratio of less than 50% may lead to poor either or both of scratch resistance and ink receptivity, unpreferably. Typically, at least 75% of $R_f$ is fluorinated. This means that at least 75% of hydrogen atoms constituting $R_f$ are substituted with a fluorine atom. In some aspects, $R_f$ is completely fluorinated (100% fluorination). For example, $R_f$ can be represented by —$(CF_2)_y CF_3$, wherein y is 0 or 1 to 10. Typically, y is 0 or 1 to 4.

In the general formula (I), m is 0 or 1 to 10, and typically 0, 1, 2, or 3, n is 1 to 30, and typically 5 to 25. x is 1 to 4 and, typically, x is 1 or 2. It is also possible to substitute one, or two or more of hydrogen atoms in a —$(CH_2)$— group with one, or two or more other substituent(s), for example, an alkyl group for formation of branching, or an oxyalkylene group.

In the general formula (I), $R^1$ is hydrogen, or a substituted or non-substituted alkyl group each having 1 to 10 carbon atoms, and the group may be branched or linear. It is also possible to substitute such $R^1$ group with partially or completely fluorinated one, or two or more $R_f(s)$ having at most 10 carbon atoms. Typically, $R^1$ is a substituted or non-substituted alkyl group having 1 to 4 carbon atoms. In the general formula (I), the —O-moiety is linked to the urethane moiety.

The polyurethane including a unit comprising a substituent having an acidic hydrogen atom and a unit of the formula (I) can be synthesized by a method in which a diol comprising a substituent having an acidic hydrogen atom, a diol including a unit of the formula (I) and, if necessary, the other diol are reacted with a diisocyanate, or a method in which a mixture prepared by optionally combining each diol and each diisocyanate used in the above method is reacted. The unit comprising a substituent having an acidic hydrogen atom includes, for example, diols having a carboxyl group.

Examples of the diol having a carboxyl group include 3,5-dihydroxybenzoic acid, 2,2-bis(hydroxymethyl)propionic acid, 2,2-bis(hydroxyethyl)propionic acid, 2,2-bis(3-hydroxypropylpropionic acid, 2,2-bis(hydroxymethyl)acetic acid, bis-(4-hydroxyphenyl)acetic acid, 4,4-bis-(4-hydroxyphenyl)pentanoic acid, tartaric acid and the like, and of these, 2,2-bis(hydroxymethyl)propionic acid is more preferable in view of reactivity with the isocyanate.

The diol including a unit of the formula (I) can be a diol represented by the following general formula (II):

[Chemical Formula 4]

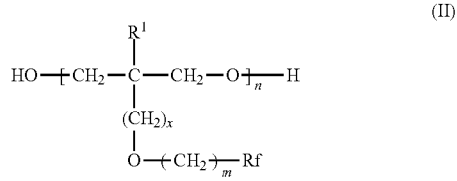

wherein $R_f$, $R^1$, m, n, and x are as defined in the general formula (I).

The diol contained in the formula (II) includes, for example, the following diol.

[Chemical Formula 5]

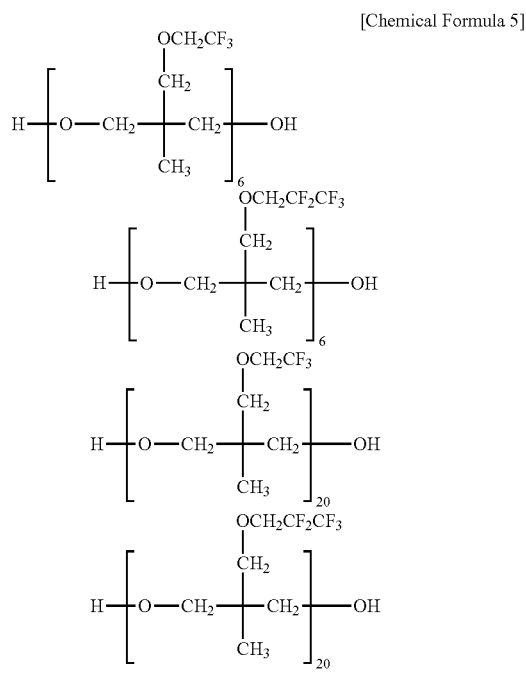

Examples of the other diol include dimethylolpropane, polypropylene glycol, neopentyl glycol, 1,3-propanediol, polytetramethylene ether glycol, polyester polyol, polymerpolyol, polycaprolactone polyol, polycarbonate diol, 1,4-butanediol, 1,5-pentadiol, 1,6-hexanediol, polybutadiene polyol and the like.

Examples of the diisocyanate include 4,4'-diphenylmethane diisocyanate, xylylene diisocyanate, naphthylene-1,5-diisocyanate, tetramethylxylene diisocyanate, hexamethylene diisocyanate, toluene-2,4-diidocyanate, isophorone diisocyanate, hydrogenated xylylene diisocyanate, dicyclohexylmethane diisocyanate, norbornene diisocyanate, trimethyl hexamethylene diisocyanate, dimer acid diisocyanate and the like.

In the polyurethane used in the present invention, the unit of the diol having a carboxyl group accounts for 10 to 70 mol %, and preferably 30 to 50 mol %. The unit of the diol accounts for less than 10 mol % may lead to poor development, unpreferably. The unit of the diol accounts for more than 70 mol % may lead to poor ink receptivity or poor print run length, unpreferably. In the polyurethane used in the present invention, the unit of the diol represented by the formula (I) accounts for 0.1 to 30 mol %, and preferably 0.3 to 15 mol %. The unit of the diol accounts for less than 0.1 mol % may lead to poor scratch resistance or poor ink receptivity, unpreferably. The unit of the diol accounts for more than 30 mol % may lead to poor development, unpreferably. When isocyanate groups remain at the end of the polymer, it is possible to finally synthesize without causing remaining of isocyanate groups by treating with alcohols or amines.

A weight average molecular weight of the polyurethane including a unit comprising a substituent having an acidic hydrogen atom and a unit of the formula (I) is preferably within a range from 2,000 to 100,000. When the weight average molecular weight of the polyurethane is less than 2,000, the image area obtained by forming images may tend to be insufficient in durability, resulting in poor ink receptivity. On the other hand, when the weight average molecular weight of the polyurethane is more than 100,000, sensitivity may tend to be poor.

The content of the polyurethane including a unit comprising a substituent having an acidic hydrogen atom and a unit of the formula (I) in the image forming layer is preferably within a range from 2 to 99.4% by weight, and more preferably from 10 to 90% by weight, based on the solid content of the layer. The content of the polyurethane including a unit comprising a substituent having an acidic hydrogen atom and a unit of the formula (I) of less than 2% by weight may lead to a low developing rate, unpreferably. The content of more than 99.4% by weight may lead to poor storage stability, disadvantageously. If necessary, a polyurethane including two or more kinds of units comprising a substituent having an acidic hydrogen atom and two or more kinds of units of the formula (I) may be used in combination.

The image forming layer of the present invention can comprise, in addition to the above polyurethane including a unit comprising a substituent having an acidic hydrogen atom and a unit of the formula (I), a resin other than the polyurethane, which is water-insoluble and alkali-soluble or alkali-dispersible in an aqueous alkali solution. The resin preferably has at least a functional group such as a hydroxyl group, a carboxyl group, a sulfonic acid group, a phosphoric acid group, an imide group, or an amide group, so as to be soluble or dispersible in an aqueous alkali solution. Therefore, the resin, which is water-insoluble and alkali-soluble or alkali-dispersible in an aqueous alkali solution, can be preferably produced by polymerizing a monomer mixture comprising one or more ethylenically unsaturated monomers having functional groups such as a hydroxyl group, a carboxyl group, a sulfonic acid group, a phosphoric acid group, an imide group, an amide group, and a combination thereof.

The ethylenically unsaturated monomer can be a compound represented by the following formula:

[Chemical Formula 6]

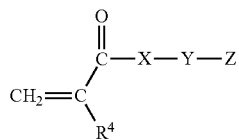

wherein $R^4$ is a hydrogen atom, a $C_{1-22}$ linear, branched or cyclic alkyl group, a $C_{1-22}$ linear, branched or cyclic substituted alkyl group, a $C_{6-24}$ aryl group, or a substituted aryl group, and the substituent is selected from a $C_{1-4}$ alkyl group, an aryl group, a halogen atom, a keto group, an ester group, an alkoxy group, or a cyano group; X is O, S, and $NR^5$, in which $R^5$ is hydrogen, a $C_{1-22}$ linear, branched or cyclic alkyl group, a $C_{1-22}$ linear, branched or cyclic substituted alkyl group, a $C_{6-24}$ aryl group, or a substituted aryl group, and substituent is selected from a $C_{1-4}$ alkyl group, an aryl group, a halogen atom, a keto group, an ester group, an alkoxy group, or a cyano group; Y is a single bond, or $C_{1-22}$ linear, branched or cyclic alkylene, alkyleneoxyalkylene, poly(alkyleneoxy) alkylene, or alkylene-NHCONH—; and Z is a hydrogen atom, a hydroxy group, carboxylic acid, —$C_6H_4$—$SO_2NH_2$, —$C_6H_3$—$SO_2NH_2$(—OH), or a group represented by the following formula:

[Chemical Formula 7]

[Chemical Formula 8]

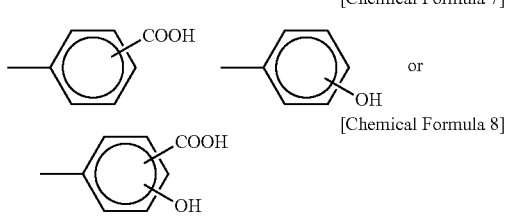

or a mixture thereof.

Examples of the ethylenically unsaturated monomer include, in addition to acrylic acid and methacrylic acid, compounds represented by the following formulas, and a mixture thereof.

[Chemical Formula 9]

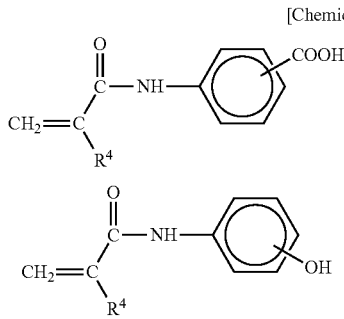

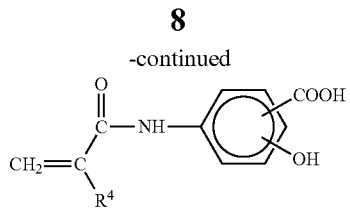

[Chemical Formula 10]

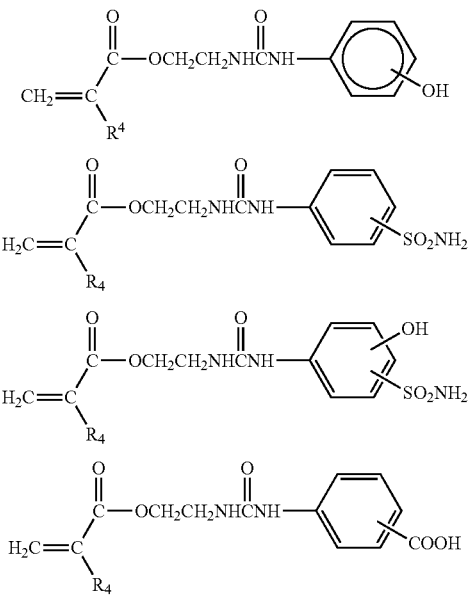

The monomer mixture can include the other ethylenically unsaturated comonomer. The other ethylenically unsaturated comonomer includes, for example, the following monomers: acrylic acid esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethyl hydroxypropyl acrylate, 5-hydroxypentyl acrylate, trimethylolpropane monoacrylate, pentaerythritol monoacrylate, glycidyl acrylate, benzyl acrylate, methoxybenzyl acrylate, and tetrahydroacrylate;

aryl acrylates such as phenyl acrylate and furfuryl acrylate;

methacrylic acid esters such as methyl methacrylate, ethyl methacrylate, propyl methacrylate, isopropyl methacrylate, allyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate;

aryl methacrylates such as phenyl methacrylate, cresyl methacrylate, and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide, and N-benzylacrylamide;

N-arylacrylamides such as N-phenylacrylamide, N-tolylacrylamide, N-nitrophenylacrylamide, N-naphthylacrylamide, and N-hydroxyphenylacrylamide;

N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide, and N,N-dicyclohexylacrylamide;

N,N-arylacrylamides such as N-methyl-N-phenylacrylamide, N-hydroxyethyl-N-methylacrylamide, and N-2-acetamidoethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide, and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide, and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide, and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate, and allyloxyethanol;

vinyl ethers such as hexyl vinyl ether, octyl vinyl ether, dodecyl vinyl ether, ethyl hexyl vinyl ether, methoxyethyl vinyl ether, ethoxyethyl vinyl ether, chloroethyl vinyl ether, 1-methyl-2,2-dimethyl propyl vinyl ether, 2-ethyl butyl vinyl ether, hydroxyethyl vinyl ether, diethylene glycol vinyl ether, dimethyl aminoethyl vinyl ether, diethyl aminoethyl vinyl ether, butyl aminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinyl naphthyl ether, and vinyl anthracenyl ether;

vinyl esters such as vinyl butyrate, vinyl isobutyrate, vinyl trimethyl acetate, vinyl diethyl acetate, vinyl valerate, vinyl caproate, vinyl chloroacetate, vinyl methoxyacetate, vinyl butoxyacetate, vinyl phenylacetate, vinyl acetoacetate, vinyl lactate, vinyl-β-phenyl butyrate, vinyl cyclohexyl carboxylate, vinyl benzoate, vinyl salicylate, vinyl chlorobenzoate, vinyl tetrachlorobenzoate, and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene, and 4-fluoro-3-trifluoromethylstyrene;

crotonic acid esters such as butyl crotonate, hexyl crotonate, crotonic acid, and glycerol monocrotonate;

itaconic acid dialkyls such as dimethyl itaconate, diethyl itaconate, and dibutyl itaconate;

dialkyls of maleic acid or fumaric acid, such as dimethyl maleate and dibutyl fumarate;

maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide; and other nitrogen atom-containing monomers such as N-vinylpyrrolidone, N-vinylpyridine, acrylonitrile, and methacrylonitrile.

Of these other ethylenically unsaturated comonomers, for example, (meth)acrylic acid esters, (meth)acrylamides, maleimides, and (meth)acrylonitriles are preferably used.

In the image forming layer of the multilayer type lithographic printing plate precursor used in the present invention, the polyurethane including a unit comprising a substituent having an acidic hydrogen atom and a unit of the formula (I) may be included in either a lower layer or an upper layer, or both a lower layer and an upper layer. While a description will be made below with respect to an aspect in which the polyurethane including a unit comprising a substituent having an acidic hydrogen atom and a unit of the formula (I) is contained in the upper layer, it is apparent that the multilayer type lithographic printing plate precursor of the present invention is not limited to this aspect.

<Lower Layer>

Typically, the lower layer is directly formed on a substrate. The lower layer constituting the image forming layer of the lithographic printing plate precursor of the present invention can comprise the above-mentioned resin other than the polyurethane, which is water-insoluble and alkali-soluble or alkali-dispersible in an aqueous alkali solution. The resin preferably has at least a functional group such as a hydroxyl group, a carboxyl group, a sulfonic acid group, a phosphoric acid group, an imide group or an amide group so as to be soluble or dispersible in an aqueous alkali solution. Therefore, the resin, which is water-insoluble and alkali-soluble or alkali-dispersible in an aqueous alkali solution, can be preferably produced by polymerizing a monomer mixture comprising one or more ethylenically unsaturated monomers having functional groups such as a hydroxyl group, a carboxyl group, a sulfonic acid group, a phosphoric acid group, an imide group, an amide group, and a combination thereof.

<Upper Layer>

The upper layer constituting the lithographic printing plate precursor of the present invention comprises a polyurethane including a unit comprising a substituent having an acidic hydrogen atom and a unit of the formula (I). It is also possible to comprise, in addition to the polyurethane, a resin, which is water-insoluble and alkali-soluble or alkali-dispersible in an aqueous alkali solution, used in the lower layer.

The content of the polyurethane including a unit comprising a substituent having an acidic hydrogen atom and a unit of the formula (I) in the upper layer is preferably within a range from 2 to 99.4% by weight, and more preferably from 10 to 90% by weight, based on the solid content of the upper layer. The content of the polyurethane of less than 2% by weight may lead to a low developing rate, unpreferably. The content of more than 99.4% by weight may lead to poor storage stability, disadvantageously. If necessary, two or more kinds of polyurethanes including a unit comprising a substituent having an acidic hydrogen atom and a unit of the formula (I) may be used in combination.

<Photothermal Conversion Material>

Either or both of the lower layer and the upper layer comprise(s) a photothermal conversion material. The photothermal conversion material may comprise in either a lower layer or an upper layer, or both a lower layer and an upper layer. The photothermal conversion material may also be contained in the layer other than the lower layer and the upper layer. For example, when a separation layer is present between the lower layer and the upper layer, the photothermal conversion material may be contained in the separation layer. The positive-working lithographic printing plate precursor of the present invention may comprise one, or two or more kinds of photothermal conversion material(s). The photothermal conversion material used in the present description means any material capable of converting electromagnetic waves into thermal energy and is a material having a maximum absorption wavelength within a near infrared or infrared range, for example, a material having a maximum absorption wavelength within a range from 760 to 1,200 nm. Such material includes, for example, various pigments or dyes.

It is possible to use, as the pigment used in the present invention, commercially available pigments and those pigments disclosed in the Color Index Manual "Saishin Ganryou Binran" (New Manual of Pigments) (edited by the Japan Pigment Technology Association, 1977), "Saishin Ganryou Ouyou Gijutsu" (New Applied Technology for Pigment) (CMC Publishing, 1986), "Insatsu Inki Gijutsu" (Printing Ink Technology) (CMC Publishing, 1984) and the like. Examples of the pigment include black pigments, yellow pigments, orange pigments, brown pigments, red pigments, violet pigments, blue pigments, green pigments, fluorescent pigments, and other polymer bond pigments. Specifically, it is possible to use insoluble azo pigments, azolake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, staining lake pigments, azine pigments, nitroso pigments, nitro pigments, natural pigments, fluorescent pigments, inorganic pigments, carbon black and the like.

Of these specific examples, carbon black is particularly preferred as a material which absorbs near infrared to infrared laser beam to efficiently generate heat, and is economically competitive. At present, grafted carbon blacks having various functional groups and having excellent dispersibility are commercially available as such carbon black and include, for example, carbon blacks disclosed in "Carbon Black Manual, 3rd edition, (edited by the Carbon Black Association) 1995, p. 167", "Characteristics of Carbon Black and Optimal Formulation and Applied Technology (Technical Information Association) 1997, p. 111" and the like, and all of them are preferably used in the present invention.

These pigments may be used without subjecting to a surface treatment or may be subjected to a known surface treatment. Examples of a known include a method of surface-coating a resin or wax, a method of adhering a surfactant, and a method of bonding a reactive material such as a silane coupling agent or an epoxy compound, polyisocyanate to the surface of a pigment. These surface treating methods are disclosed in "Kinzoku Sekken no Seishitsu to Ouyou" (Properties of Metal Soaps and Their Application) (Saiwai Shobo), "Saishin Ganryou Ouyou Gijutsu" (New Applied Technology for Pigment) (CMC Publishing, 1986), and "Insatsu Inki Gijutsu" (Printing Ink Technology) (CMC Publishing, 1984). The pigment used in the present invention preferably has a particle diameter within the range from 0.01 to 15 μm, and more preferably from 0.01 to 5 μm.

It is possible to use, as the dye used in the present invention, any known conventional dye and examples thereof include those disclosed in "Senryou Binran" (Dye Manual) (edited by the Organic Synthesis Chemistry Association, 1970), "Shikizai Kougaku Handobukku" (Coloring Material Engineering Handbook) (edited by the Coloring Material Association, Asakura Shoten, 1989), "Kougyouyou Shikiso no Gijutsu to Shijyou" (Technology and Market of Industrial Coloring Matter) (edited by CMC, 1983), and "Kagaku Binran Ouyou Kagaku Hen" (Chemistry Manual-Applied Chemistry Version) (edited by the Japan Chemistry Society, Maruzen Shoten, 1986). More specific dyes thereof are azo dyes, metal complex azo dyes, pyrazolone azo dyes, anthraquinone dyes, phthalocyanine dyes, carbonium dyes, quinoneimine dyes, methine dyes, cyanine dyes, indigo dyes, quinoline dyes, nitro dyes, xanthene dyes, thiazine dyes, azine dyes, and oxazine dyes.

It is possible to use, as the dye capable of efficiently absorbing near infrared rays or infrared rays, for example, azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salt, and metal thiolate complexes (for example, nickel thioate complex). Of these dyes, cyanine dyes are preferred and examples thereof include cyanine dyes represented by the general formula (I) disclosed in Japanese Unexamined Patent Publication (Kokai) No. 2001-305722 and compounds disclosed in [0096] to [0103] of Japanese Unexamined Patent Publication (Kokai) No. 2002-079772.

The photothermal conversion materials are particularly preferably dyes of the following formula:

[Chemical Formula 11]

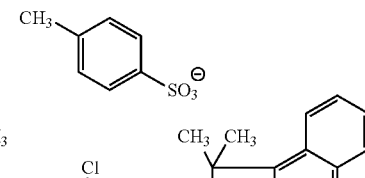

[Chemical Formula 12]

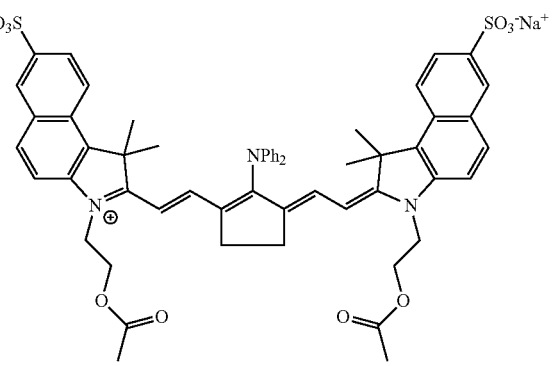

wherein Ph represents a phenyl group.

The photothermal conversion material can be added to the image forming layer including an upper layer and a lower layer (including a separation layer between an upper layer and a lower layer, as needed) in an amount within a range from 0.01 to 50% by weight, preferably from 0.1 to 20% by weight, and particularly preferably from 1 to 15% by weight. When the amount is less than 0.01% by weight, sensitivity may decrease. When the amount is more than 50% by weight, stains may be formed at the non-image area upon printing. These photothermal conversion materials may be used alone, or two or more kinds of them may be used in combination.

<Substrate>

Examples of the substrate include metal plates made of aluminum, zinc, copper, stainless steel, and iron; plastic films made of polyethylene terephthalate, polycarbonate, polyvinyl acetal, polyethylene, etc.; composite materials obtained by forming a metal layer on a paper, which is melt-coated or coated with a synthetic resin solution, using technologies such as vacuum deposition and laminate; and a material used as the substrate of the printing plate. It is particularly preferred to use a substrate made of aluminum or a composite substrate coated with aluminum.

It is preferred that the surface of the aluminum substrate is surface-treated for the purpose of enhancing water retentivity and improving adhesion with a image forming layer or an optionally formed intermediate layer. Examples of the surface treatment include roughening treatments such as brush polishing method, ball polishing method, electrolytic etching, chemical etching, liquid honing, and sandblasting, and a combination thereof. Of these, a roughening treatment including the use of electrolytic etching is particularly preferred.

As an electrolytic bath in the case of electrolytic etching, for example, an aqueous solution comprising an acid, an alkali or a salt thereof, or an aqueous solution comprising an organic solvent is used. Of these, an electrolytic solution comprising hydrochloric acid, nitric acid, or a salt thereof is particularly preferred.

Furthermore, the aluminum substrate subjected to the roughening treatment is subjected to a desmutting treatment using an aqueous solution of an acid or an alkali, if necessary. It is preferred that the aluminum substrate thus obtained is subjected to an anodic oxidation treatment. It is particularly preferred that the anodic oxidation treatment is performed using a bath comprising sulfuric acid or phosphoric acid.

If necessary, the aluminum substrate can be subjected to a silicate treatment (for example, sodium silicate, potassium silicate), a potassium fluorozirconate treatment, a phosphomolybdate treatment, an alkyl titanate treatment, a polyacrylic acid treatment, a polyvinylsulfonic acid treatment, a polyvinylphosphonic acid treatment, a phytic acid treatment, a treatment using a salt of a hydrophilic organic polymer compound and a divalent metal, a hydropholization treatment by undercoating of a water-soluble polymer having a sulfonic acid group, a coloration treatment using an acid dye, and a treatment of silicate electrodeposition.

An aluminum substrate, which was subjected to a sealing treatment after subjecting to the roughening treatment (graining treatment) and the anodic oxidation treatment, is also preferred. The sealing treatment is performed by immersing an aluminum substrate in a hot aqueous solution comprising hot water and an inorganic salt or an organic salt, or performed using a steam bath.

Another aspect of the present invention is directed to a single layer type lithographic printing plate precursor, comprising a substrate and one image forming layer formed on the substrate. It is essential that the single image forming layer, which constitutes the lithographic printing plate precursor of the present invention, comprises a resin which is water-insoluble and alkali-soluble or alkali-dispersible in an aqueous alkali solution, and also comprises a polyurethane including a unit comprising a substituent having an acidic hydrogen atom and a unit of the following general formula (I). The "single layer" type lithographic printing plate precursor means a lithographic printing plate precursor including only one layer required to provide images (image forming layer).

The image forming layer of the single layer type lithographic printing plate precursor comprises a polyurethane including a unit comprising a substituent having an acidic hydrogen atom and a unit of the formula (I). Since the polyurethane including a unit comprising a substituent having an acidic hydrogen atom and a unit of the formula (I) was described in detail, the description is not repeated here. It is also possible to comprise, in addition to the polyurethane, the above-mentioned resin which is water-insoluble and alkali-soluble or alkali-dispersible in an aqueous alkali solution. The resin preferably comprises at least a functional group such as a hydroxyl group, a carboxyl group, a sulfonic acid group, a phosphoric acid group, an imide group, or an amide group, so as to be soluble or dispersible in an aqueous alkali solution. Therefore, the resin, which is water-insoluble and alkali-soluble or alkali-dispersible in an aqueous alkali solution, can be preferably produced by polymerizing a monomer mixture comprising one or more ethylenically unsaturated monomers having functional groups such as a hydroxyl group, a carboxyl group, a sulfonic acid group, a phosphoric acid group, an imide group, an amide group, and a combination thereof. Since details of these resins were described in the multilayer type image forming layer, the description is not repeated here.

The content of the polyurethane including a unit comprising a substituent having an acidic hydrogen atom and a unit of the formula (I) in the image forming layer is preferably within a range from 2 to 99.4% by weight, and more preferably from 10 to 90% by weight, based on the solid content of the layer. The content of the polyurethane including a unit comprising a substituent having an acidic hydrogen atom and a unit of the formula (I) of less than 2% by weight may lead to a low developing rate, disadvantageously. The content of more than 99.4% by weight may lead to poor storage stability, unpreferably. If necessary, a polyurethane including two or more kinds of units comprising a substituent having an acidic hydrogen atom and two or more kinds of units of the formula (I) may be used in combination.

<Photothermal Conversion Material>

The image forming layer can comprise one, or two or more photothermal conversion material(s). The photothermal conversion material can be added in the image forming layer in the proportion of 0.01 to 50% by weight, preferably 0.1 to 20% by weight, and particularly preferably 1 to 15% by weight, based on the image forming layer. When the amount is less than 0.01% by weight, sensitivity may decrease. When the amount is more than 50% by weight, stains may be formed at the non-image area upon printing. These photothermal conversion materials may be used alone, or two or more kinds of them may be used in combination.

The photothermal conversion material is contained in the image forming layer, and may be contained in the additional non-image forming layer. Namely, the photothermal conversion material may be disposed in a non-image forming layer which is in contact with a single image forming layer. Since specific examples of the photothermal conversion material were described in detail in the multilayer type image forming layer, the description is not repeated here.

The lithographic printing plate precursor of the present invention is produced by dissolving or dispersing components of an image forming layer in an organic solvent, coating the resultant solution or dispersion on a substrate, and drying the solution or dispersion to form an image forming layer on the substrate. In an aspect, the multilayer type lithographic printing plate precursor is produced by dissolving or dispersing constituent components of a lower layer and an upper layer in an organic solvent, sequentially coating the resultant solution or dispersion on a substrate, and drying the solution or dispersion to form a lower layer on the substrate and to form an uppermost layer thereon.

It is possible to use, as the organic solvent in which constituent components of the image forming layer are dissolved or dispersed, any conventionally known organic solvent. In view of an advantage upon drying, an organic solvent having a boiling point within a range from 40 to 200° C., particularly from 60 to 160° C. is selected. When the image forming layer is composed of a lower layer and an upper layer, the same organic solvent can be used.

Examples of the organic solvent include alcohols such as methyl alcohol, ethyl alcohol, n- or iso-propyl alcohol, n- or iso-butyl alcohol, and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, and acetylacetone; hydrocarbons such as hexane, cyclohexane, heptane, octane, nonane, decane, benzene, toluene, xylene, and methoxybenzene; acetate esters such as ethyl acetate, n- or iso-propyl acetate, n- or iso-butyl acetate, ethylbutyl acetate, and hexyl acetate; halides such as methylene dichloride, ethylene dichloride, and monochlorobenzene; ethers such as isopropyl ether, n-butyl ether, dioxane, dimethyldioxane, and tetrahydrofuran; polyhydric alcohols such as ethylene glycol, ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate, ethylene glycol dimethyl ether, ethylene glycol diethyl ether, ethylene glycol dibutyl ether, methoxyethoxyethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, and 1-methoxy-2-propanol, and a derivative thereof; and special solvents such as dimethyl sulfoxide, N,N-dimethylformamide, methyl lactate, and ethyl lactate. These organic solvents are used alone or in combination. The solid content of the solution or dispersion to be coated is preferably from 2 to 50% by weight. The solid content as used herein means components excluding the organic solvent.

It is possible to use, as the method of coating the solution or dispersion of constituent components of the image forming layer, for example, methods such as roll coating, dip coating, air knife coating, gravure coating, gravure offset coating, hopper coating, blade coating, wire doctor coating, spray coating, and die coating methods. The coating amount is preferably within a range from 10 to 100 ml/m$^2$.

The solution or dispersion coated on the substrate is usually dried by heated air. The drying temperature (temperature of heat air) is preferably within a range from 30 to 200° C., and particularly from 40 to 140° C. The solution or dispersion can also be dried by not only a method of maintaining the drying temperature at a given temperature during drying, but also a method of stepwise raising the drying temperature.

Preferred results may be sometimes obtained by dehumidifying drying air. The dry air is preferably supplied to the surface to be coated at a wind velocity within a range from 0.1 to 30 m/sec, and particularly preferably from 0.5 to 20 m/sec.

The coating amount of the image forming layer is usually within the range from about 0.5 to about 5 g/m$^2$ in terms of dry weight. In the case of the multilayer type, each coating amount of the lower layer and the upper layer is usually within the range from about 0.1 to about 5 g/m$^2$ in terms of dry weight.

<Other Components of Image Forming Layer>

To the image forming layer (also including a multilayer type) of the lithographic printing plate precursor of the present invention, known additives, for example, colorants (dyes, pigments), surfactants, plasticizers, stability improvers, development accelerators, development inhibitors and lubricants (silicone powder, etc.) can be added, if necessary.

Examples of preferred dye include basic oil-soluble dyes such as Crystal Violet, Malachite Green, Victoria Blue, Methylene Blue, Ethyl Violet, Rhodamine B and the like. Examples of commercially available products include "Victoria Pure Blue BOH" [manufactured by Hodogaya Kagaku Kogyo K.K.], "Oil Blue #603" [manufactured by Orient Chemical Industries, Ltd.], "VPB-Naps (naphthalene sulfonate of Victoria Pure Blue)" [manufactured by Hodogaya Kagaku Kogyo K.K.], "D11" [manufactured by PCAS]. Examples of the pigment include Phthalocyanine Blue, Phthalocyanine Green, Dioxadine Violet, Quinacridone Red and the like.

Examples of the surfactant include fluorinated surfactants, silicone surfactants and the like.

Examples of the plasticizer include diethyl phthalate, dibutyl phthalate, dioctyl phthalate, tributyl phosphate, trioctyl phosphate, tricresyl phosphate, tri(2-chloroethyl)phosphate, tributyl citrate and the like.

It is possible to use, as the known stability improver, phosphoric acid, phosphorous acid, oxalic acid, tartaric acid, malic acid, citric acid, dipicolic acid, polyacrylic acid, benzenesulfonic acid and toluenesulfonic acid in combination.

Examples of other stability improvers include known phenolic compounds, quinones, N-oxide compounds, amine based compounds, sulfide group-containing compounds, nitro group-containing compounds, and transition metal compounds. Specific examples thereof include hydroquinone, p-methoxyphenol, p-cresol, pyrogallol, t-butyl catechol, benzoquinone, 4,4'-thiobis(3-methyl-6-t-butylphenol), 2,2'-methylenebis(4-methyl-6-t-butylphenol), 2-mercaptobenzimidazole, N-nitrosophenylhydroxyamine primary cerium salt and the like.

Examples of the development accelerator include acid anhydrides, phenols, organic acids and the like. Acid anhydrides are preferably cyclic acid anhydrides. It is possible to use, as the cyclic acid anhydride, those disclosed in the specification of U.S. Pat. No. 4,115,128, for example, phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride, pyromellitic anhydride and the like. Examples of the non-cyclic anhydride include acetic anhydride and the like. Examples of phenols include bisphenol A, 2,2'-bishydroxysulfon, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3", 4"-tetrahydroxy-3,5,3',5'-tetramethyltriphenylmethane and the like.

Examples of organic acids include those disclosed in Japanese Unexamined Patent Publication (Kokai) No. 60-88942 and Japanese Unexamined Patent Publication (Kokai) No. 2-96755, for example, sulfonic acids, sulfinic acids, alkylsulfuric acids, phosphonic acids, phosphate esters and carboxylic acids, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid and the like.

The development inhibitor is not particularly limited as long as it causes an interaction with the alkali-soluble resin and substantially lowers solubility of the alkali-soluble resin in the developing solution in the unexposed area, and also becomes soluble in the developing solution as a result of the weakened interaction in the exposed area. In particular, quaternary ammonium salts and polyethylene glycol-based compounds are used particularly preferably. Of the above infrared absorbers and colorants, some compounds function as the development inhibitor and are preferably exemplified. The development inhibitor further includes substances, which are heat-decomposable and substantially lowers solubility of the alkali-soluble resin in a non-decomposable state, for example, onium salts, 0-quinonediazide compounds, aromatic sulfone compounds, aromatic sulfonate ester compounds and the like.

The amount of these various additives varies depending on the purposes, and is preferably within a range from 0 to 30% by weight based on the solid content of the image forming layer. In the case of a multilayer type, the amount of additives is preferably within a range from 0 to 30% by weight based on the total solid content of the lower layer and the upper layer.

In addition, other alkali-soluble or dispersible resins can be optionally used in combination in the image forming layer of the lithographic printing plate precursor of the present invention. Examples of the other alkali-soluble or dispersible resin include copolymers of alkali-soluble group-containing monomers such as acrylic acid, methacrylic acid, maleic acid, maleic anhydride, itaconic acid and itaconic anhydride with other monomers, polyester resins, acetal resins and the like.

In the lithographic printing plate precursor of the present invention, the upper layer may comprise matting agents or a matte layer may be formed on the upper layer for the purpose of improving de-interleaving paper property and improving plate transportation properties of an automatic plate loader.

<Exposure and Development>

The infrared-sensitive or thermosensitive lithographic printing plate precursor of the present invention can be used as a so-called computer-to-plate (CTP) plate which can directly write an image on a plate based on digital information from a computer, using a laser.

As a laser beam source in the present invention, a high-output laser having a maximum strength in a near infrared to infrared range is used most preferably. Examples of the high-output laser having a maximum intensity in the near infrared to infrared range include various lasers, each having a maximum intensity in the near infrared to infrared range of 760 to 1200 nm, for example, a semiconductor laser and a YAG laser.

After writing an image on an image forming layer using a laser, the lithographic printing plate precursor of the present invention is treated by an image formation method in which the non-image area is removed by a development treatment using a wet process. Namely, the method for forming a lithographic printing plate of the present invention comprises the steps of imagewisely exposing the lithographic printing plate precursor of the present invention using infrared rays; and developing the exposed lithographic printing plate precursor to remove the exposed area, thus forming an image area and a non-image area.

Examples of the developing solution used in the development treatment include an aqueous alkali solution (aqueous basic solution). The pH of the aqueous alkali solution is preferably low pH (pH of 12 or lower). Specifically, the pH is preferably from 6 to 12, more preferably from 8 to 11.5, and particularly preferably from 10 to 11.

Examples of the alkali agent used in the developing solution include inorganic alkali compounds such as sodium silicate, potassium silicate, potassium hydroxide, sodium hydroxide, lithium hydroxide, sodium, potassium or ammonium salt of secondary or tertiary phosphoric acid, sodium metasilicate, sodium carbonate and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine, and ethylenediamine. In the method for producing a lithographic printing plate of the present invention, a developing solution substantially comprising no silicate is preferable. Substantially comprising no silicate means that the content of alkali silicates such as sodium silicate, potassium silicate and sodium metasilicate in a developing solution is 0.1% by weight or less.

The content of the alkali agent in the developing solution is preferably within a range from 0.005 to 10% by weight, and particularly preferably from 0.05 to 5% by weight. When the content of the alkali agent in the developing solution is less than 0.005% by weight, development may tend to become inferior. The content of more than 10% by weight may tend to exert an adverse influence such as erosion of the image area tends upon development, unpreferably.

To the developing solution, an organic solvent can also be added. Examples of the organic solvent, which can be added to the developing solution, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methyl phenyl carbitol, n-amyl alcohol, methylamyl alcohol, xylene, methylene dichloride, ethylene dichloride, monochlorobenzene and the like. When the organic solvent is added to the developing solution, the amount of the organic solvent is preferably 20% by weight or less, and particularly preferably 10% by weight or less.

Furthermore, it is possible to optionally add water-soluble sulfites such as lithium sulfite, sodium, potassium sulfite and magnesium sulfite; hydroxyaromatic compounds such as alkali-soluble pyrazoline compound, alkali-soluble thiol compound and methylresolcin; water softeners such as polyphosphates and aminopolycarboxylic acids; anionic surfactants such as sodium isopropyl naphthalene sulfonate, sodium n-butyl naphthalene sulfonate, sodium N-methyl-N-pentadecyl aminoacetate and sodium lauryl sulfate; various surfactants such as nonionic surfactants, cationic surfactants, amphoteric surfactants and fluorine based surfactants; and various defoamers, in the developing solution.

As the developing solution, a commercially available developing solution for a negative-working or positive-working PS plate is practically used. Specifically, a solution prepared by diluting a commercially available concentrated developing solution for a negative-working or positive-working PS plate by 1 to 1,000 times can be used as the developing solution in the present invention.

The temperature of the developing solution is preferably within a range from 15 to 40° C., and the immersion time is preferably within a range from 1 second to 2 minutes. If necessary, it is also possible to slightly rub the surface during development.

The developed lithographic printing plate is subjected to either or both of washing with water and a treatment using a desensitizing agent (finishing gum). The desensitizing agent includes, for example, a water-soluble natural polymer such as gum arabic, dextrin, or carboxymethyl cellulose; and an aqueous solution comprising a water-soluble synthetic polymer such as polyvinyl alcohol, polyvinyl pyrrolidone, or polyacrylic acid. If necessary, acids and surfactants are added to these aqueous desensitizing agents. After subjecting to a treatment using a surface protecting solution, the lithographic printing plate was dried and used for printing as the printing plate.

For the purpose of improving print run length of the resultant lithographic printing plate, the lithographic printing plate can also be subjected to a baking treatment after the development treatment.

A baking treatment is carried out by the steps of (i) washing the lithographic printing plate obtained by the above treating method to remove a rinsing solution or a gum solution, followed by squeezing, (ii) spreading a baking solution over the entire plate without causing unevenness, followed by drying, (iii) performing baking under the temperature conditions of 180 to 300° C. in an oven for 1 to 30 minutes, and (iv) washing the plate with water to remove the baking solution, followed by gumming and further drying.

The lithographic printing plate precursor of the present invention as mentioned above can provide a high resolution positive image using an infrared laser, and is also excellent in resistance to a UV ink washing solvent and is suited for UV ink printing since a lower layer itself has solvent resistance.

EXAMPLES

The present invention will be described in more detail by way of Examples. However, the present invention is not limited to the following Examples.

Synthesis Example 1 of Polyurethane

In a 500 ml round-bottom three-necked flask equipped with a concentrator and a stirrer, 29.1 g of 4,4'-diphenyl-methane diidocyanate, 20.2 g of toluene-2,4-diidocyanate, 6.3 g of neopentyl glycol, 23.7 g of 2,2-bis(hydroxymethyl) propionic acid, 10.7 g of polyneopentyl glycol having a fluorine group represented by the following Formula, and 270 g of 3-pentanone were charged. After adding 0.3 g of dibutyltin didodecanoate, the reaction mixture was heated to 80° C. while stirring. The reaction was continued at 80° C. for 6 hours. Thus, a polyurethane (1) was obtained. A weight average molecular weight as determined by GPC was 22,000. An acid value was 110.

[Chemical Formula 13]

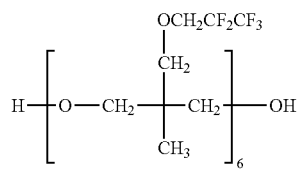

Polyneopentyl glycol having a fluorine group

Synthesis Examples 2 to 11 of Polyurethane

In the same manner as in Synthesis Example 1, except that diisocyanates and dials shown in Table 1 were used, polyurethanes (2) to (11) were obtained.

TABLE 1

Diisocyanate and Diol of Urethane Synthesis Examples 2 to 11

| No. | Diisocyanate | ratio | Diol | ratio |
|---|---|---|---|---|
| (2) | OCN—⟨C6H4⟩—CH2—⟨C6H4⟩—NCO | | HOCH2—C(CH3)(COOH)—CH2OH | 94 mol % |
| | | | H—[O—CH2—C(CH2OCH2CF3)(CH3)—CH2]6—OH | 6 mol % |

Diisocyanate:Diol = 1:0.8  Molecular weight: 8,000

| (3) | OCN—⟨C6H4⟩—CH2—⟨C6H4⟩—NCO | | HOCH2—C(CH3)(COOH)—CH2OH | 82 mol % |
| | | | HOCH2—C(CH3)(CH3)—CH2OH | 15 mol % |
| | | | H—[O—CH2—C(CH2OCH2CF3)(CH3)—CH2]20—OH | 3 mol % |

Diisocyanate:Diol = 1:1.1  Molecular weight: 13,000

TABLE 1-continued
Diisocyanate and Diol of Urethane Synthesis Examples 2 to 11
| No. | Diisocyanate | ratio | Diol | ratio |
|---|---|---|---|---|
| (4) | 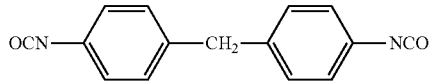 | | 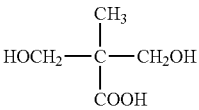 | 88 mol % |
| | | | 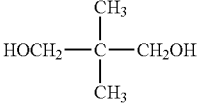 | 9 mol % |
| | | | 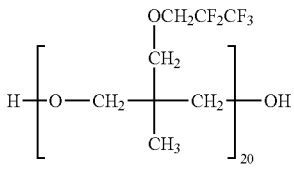 | 3 mol % |
Diisocyanate:Diol = 1:1.1 Molecular weight: 14,000
| (5) | 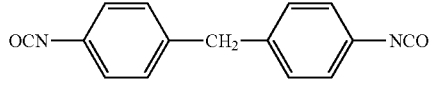 | 80 mol % | 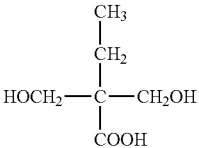 | 75 mol % |
| | 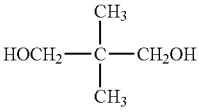 | 20 mol % | 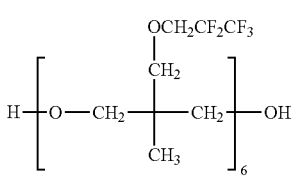 | 20 mol % |
| | | | 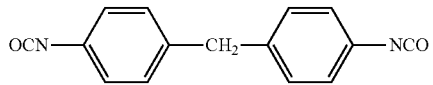 | 5 mol % |
Diisocyanate:Diol = 1:1.07 Molecular weight: 20,000
| (6) | 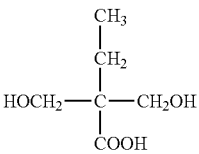 | 50 mol % |  | 77 mol % |
| | 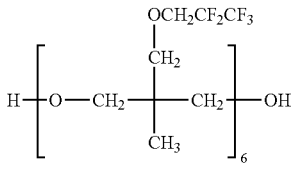 | 50 mol % | HO—CH$_2$—⬡—CH$_2$—OH | 18 mol % |
| | | | 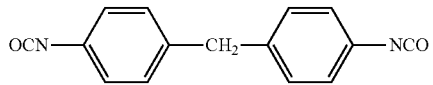 | 5 mol % |
Diisocyanate:Diol = 1:1.05 Molecular weight: 22,000

TABLE 1-continued

Diisocyanate and Diol of Urethane Synthesis Examples 2 to 11

| No. | Diisocyanate | ratio | Diol | ratio |
|---|---|---|---|---|
| (7) | OCN—C₆H₄—CH₂—C₆H₄—NCO | 50 mol % | HOCH₂—C(CH₃)(COOH)—CH₂OH | 77 mol % |
| | 2,4-TDI (OCN, CH₃ on benzene ring) | 50 mol % | HO—(CH₂)₆—OH | 20 mol % |
| | | | H—[O—CH₂—C(CH₃)(CH₂OCH₂CF₂CF₃)—CH₂]₂₀—OH | 3 mol % |
| | Diisocyanate:Diol = 1:1.05 Molecular weight: 24,000 | | | |
| (8) | OCN—C₆H₄—CH₂—C₆H₄—NCO | 80 mol % | HOCH₂—C(CH₃)(COOH)—CH₂OH | 88 mol % |
| | OCN—(CH₂)₆—NCO | 20 mol % | HOCH₂—C(CH₃)₂—CH₂OH | 9 mol % |
| | | | H—[O—CH₂—C(CH₃)(CH₂OCH₂CF₂CF₃)—CH₂]₂₀—OH | 3 mol % |
| | Diisocyanate:Diol = 1:1.05 Molecular weight: 19,000 | | | |
| (9) | OCN—C₆H₄—CH₂—C₆H₄—NCO | 80 mol % | HOCH₂—C(CH₃)(COOH)—CH₂OH | 88 mol % |
| | IPDI | 20 mol % | HOCH₂—C(CH₃)₂—CH₂OH | 9 mol % |
| | | | H—[O—CH₂—C(CH₃)(CH₂OCH₂CF₂CF₃)—CH₂]₂₀—OH | 3 mol % |
| | Diisocyanate:Diol = 1:1.1 Molecular weight: 18,000 | | | |
| (10) | OCN—C₆H₄—CH₂—C₆H₄—NCO | 100 mol % | HOCH₂—C(CH₃)(COOH)—CH₂OH | 75 mol % |

TABLE 1-continued

Diisocyanate and Diol of Urethane Synthesis Examples 2 to 11

| No. | Diisocyanate | ratio | Diol | ratio |
|---|---|---|---|---|
| | | | HOCH$_2$—C(CH$_3$)(CH$_3$)—CH$_2$OH | 14 mol % |
| | | | H—[O—CH$_2$—C(CH$_2$OCH$_2$CF$_2$CF$_3$)(CH$_3$)—CH$_2$]$_6$—OH | 11 mol % |
| | Diisocyanate:Diol = 1:1.07 Molecular weight: 20,000 | | | |
| (11) | OCN—C$_6$H$_4$—CH$_2$—C$_6$H$_4$—NCO | 50 mol % | HOCH$_2$—C(CH$_3$)(COOH)—CH$_2$OH | 65 mol % |
| | OCN—C$_6$H$_3$(NCO)(CH$_3$) | 50 mol % | HOCH$_2$—C(CH$_3$)(CH$_3$)—CH$_2$OH | 35 mol % |
| | Diisocyanate:Diol = 1:1.06 Molecular weight: 23,000 | | | |

Example in which Image Forming Layer is Composed of Two Layers

Example 1 of the Present Invention

<Substrate>

A surface of an aluminum sheet was subjected to an electrolytic roughening treatment using 2% hydrochloric acid. An average roughness Ra was 0.5 μm. Furthermore, the aluminum sheet was subjected to an anodizing treatment in an aqueous 20% sulfuric acid solution to form 2.7 g/m$^2$ of an oxide film. The anodized aluminum sheet was dipped in an aqueous 2.5% by weight sodium silicate solution at 70° C. for 30 seconds, washed with water and then dried.

<Image Forming Layer>

On the substrate thus obtained, a coating solution 1 for a lower layer shown in Table 2 was coated in a coating weight of 1.4 g/m$^2$ using a bar coater, followed by drying at 135° C. for 40 seconds and further cooling to 35° C. Furthermore, a coating solution 1 for an upper layer shown in Table 3 was coated in a coating weight of 0.6 g/m$^2$ using a bar coater, followed by drying at 140° C. for 40 seconds and further slow cooling to a temperature of 20 to 26° C. Thus, a lithographic printing plate precursor was obtained.

TABLE 2

| Coating solution 1 for lower layer | |
|---|---|
| Components | Amount |
| N-phenylmaleimide/methacrylic acid/methacrylamide copolymer Weight ratio: 59/15/26 Mw: 50,000 | 5.21 g |

TABLE 2-continued

| Coating solution 1 for lower layer | |
|---|---|
| Components | Amount |
| Infrared absorbing dye of the following Formula (3) | 0.94 g |
| Crystal Violet (manufactured by HODOGAYA CHEMICAL Co., Ltd.) | 0.08 g |
| BYK307 (BYK Chemie) | 0.03 g |
| Methyl ethyl ketone | 60.00 g |
| Propylene glycol monomethyl ether | 15.00 g |
| γ-Butyrolactone | 9.40 g |
| Water | 9.34 g |

[Chemical Formula 14]

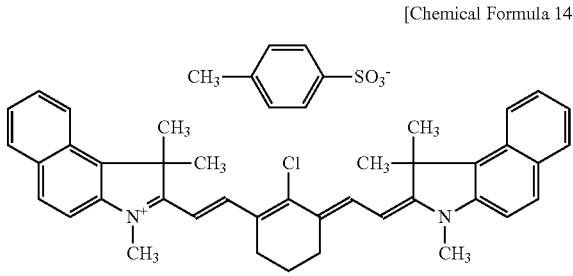

Formula (3): Infrared absorbing dye

TABLE 3

| Coating solution 1 for upper layer | |
|---|---|
| Components | Amount |
| Polyurethane (1) of Synthesis Example 1 (25% solution) | 30.00 g |
| Ethyl Violet | 0.03 g |
| Fluorinated surfactant (30% methyl ethyl ketone solution) | 0.05 g |
| 3-Pentanone | 40.00 g |
| Propylene glycol monomethyl ether | 22.50 g |
| Propylene glycol 1-monomethyl ether 2-acetate | 7.42 g |

Examples 2 to 9 of the Present Invention

In the same manner as in Example 1 of the present invention, except that the polyurethanes (2) to (9) obtained in Synthesis Examples 2 to 9 were used in place of the polyurethane (1), lithographic printing plate precursors were obtained.

Example 10 of the Present Invention

In the same manner as in Example 1 of the present invention, except that a coating solution 2 for an upper layer shown in Table 4 was used in place of the coating solution 1 for an upper layer, a lithographic printing plate precursor was obtained.

TABLE 4

| Coating solution 2 for upper layer | |
|---|---|
| Components | Amount |
| Polyurethane (10) of Synthesis Example 10 (25% solution) | 15.00 g |
| Polyurethane (11) of Synthesis Example 11 (25% solution) | 15.00 g |
| Ethyl Violet | 0.03 g |
| Fluorinated surfactant (30% methyl ethyl ketone solution) | 0.05 g |
| 3-Pentanone | 40.00 g |
| Propylene glycol monomethyl ether | 22.50 g |
| Propylene glycol 1-monomethyl ether 2-acetate | 7.42 g |

Example 11 of the Present Invention

In the same manner as in Example 1 of the present invention, except that a coating solution 2 for an upper layer shown in Table 5 was used in place of the coating solution 1 for an upper layer, a lithographic printing plate precursor was obtained.

TABLE 5

| Coating solution 3 for upper layer | |
|---|---|
| Components | Amount |
| Polyurethane (1) of Synthesis Example 1 (25% solution) | 30.00 g |
| Infrared absorbing dye of Formula (3) | 0.15 g |
| Ethyl Violet | 0.03 g |
| Fluorinated surfactant (30% methyl ethyl ketone solution) | 0.05 g |
| 3-Pentanone | 62.40 g |

TABLE 5-continued

| Coating solution 3 for upper layer | |
|---|---|
| Components | Amount |
| Propylene glycol 1-monomethyl ether 2-acetate | 7.37 g |

Examples 12 to 13 of the Present Invention

In the same manner as in Example 11 of the present invention, except that the polyurethanes (2) and (3) obtained in Synthesis Examples 2 and 3 were used in place of the polyurethane (1), lithographic printing plate precursors were obtained.

Example 14 of the Present Invention

In the same manner as in Example 1 of the present invention, except that a coating solution 4 for an upper layer shown in Table 6 was used in place of the coating solution 1 for an upper layer, a lithographic printing plate precursor was obtained.

TABLE 6

| Coating solution 4 for upper layer | |
|---|---|
| Components | Amount |
| Polyurethane (1) of Synthesis Example 1 (25% solution) | 18.77 g |
| Ammonia-modified compound of styrene/maleic anhydride copolymer (molar ratio of styrene:maleic anhydride = 3:1, molecular weight: 10,000) | 1.25 g |
| Ethyl Violet | 0.03 g |
| Fluorinated surfactant (30% methyl ethyl ketone solution) | 0.05 g |
| 3-Pentanone | 49.90 g |
| Propylene glycol monomethyl ether | 22.50 g |
| Propylene glycol 1-monomethyl ether 2-acetate | 7.50 g |

Example 15 of the Present Invention

In the same manner as in Example 1 of the present invention, except that a coating solution 5 for an upper layer shown in Table 7 was used in place of the coating solution 1 for an upper layer, a lithographic printing plate precursor was obtained.

TABLE 7

| Coating solution 5 for upper layer | |
|---|---|
| Components | Amount |
| Polyurethane (1) of Synthetic Example 1 (25% solution) | 17.60 g |
| Styrene/maleic anhydride copolymer (molar ratio of styrene:maleic anhydride = 3:1, molecular weight: 10,000) | 1.40 g |
| Infrared absorbing dye of Formula (3) | 0.15 g |
| Ethyl Violet | 0.03 g |
| Fluorinated surfactant (30% methyl ethyl ketone solution) | 0.05 g |
| 3-Pentanone | 48.27 g |
| Propylene glycol monomethyl ether | 25.00 g |
| Propylene glycol 1-monomethyl ether 2-acetate | 7.50 g |

Comparative Example 1

In the same manner as in Example 1 of the present invention, except that a polyurethane (11) obtained in Synthesis Example 11 was used in place of the polyurethane (1), a lithographic printing plate precursor was obtained.

Comparative Example 2

In the same manner as in Example 1 of the present invention, except that a coating solution 6 for an upper layer shown in Table 8 was used in place of the coating solution 1 for an upper layer, a lithographic printing plate precursor was obtained.

TABLE 8

| Coating solution 6 for upper layer | |
|---|---|
| Components | Amount |
| m,p-Cresol novolac resin (m/p = 6/4, Mw = 3,500) | 8.00 g |
| Ethyl Violet | 0.03 g |
| Fluorinated surfactant (30% methyl ethyl ketone solution) | 0.05 g |
| Propylene glycol monomethyl ether | 91.95 g |

Comparative Example 3

In the same manner as in Example 1 of the present invention, except that no upper layer was formed, a lithographic printing plate precursor was obtained.

Example in which Image Forming Layer is Single Layer

Example 16 of the Present Invention

<Image Forming Layer>

On the substrate obtained in the same manner as in Example 1 of the present invention, a coating solution 1 shown in Table 9 was coated in a coating weight of 1.5 g/m$^2$ using a bar coater, followed by drying at 135° C. for 40 seconds and further slow cooling to a temperature of 20 to 26° C. Thus, a lithographic printing plate precursor was obtained.

TABLE 9

| Coating solution 1 | |
|---|---|
| Components | Amount |
| Polyurethane (1) of Synthetic Example 1 (25% solution) | 21.44 g |
| Infrared absorbing dye of Formula (3) | 0.52 g |
| Crystal Violet (manufactured by Hodogaya Kagaku Kogyo K.K.) | 0.09 g |
| BYK 307 (BYK Chemie) | 0.02 g |
| Fluorinated surfactant (30% methyl ethyl ketone solution) | 0.05 g |
| Methyl ethyl ketone | 47.88 g |
| Propylene glycol monomethyl ether | 30.00 g |

Example 17 of the Present Invention

In the same manner as in Example 16 of the present invention, except that a coating solution 2 shown in Table 10 was used in place of the coating solution 1, a lithographic printing plate precursor was obtained.

TABLE 10

| Coating solution 2 | |
|---|---|
| Components | Amount |
| Polyurethane (1) of Synthetic Example 1 (25% solution) | 10.33 g |
| N-phenyl maleimide/methacrylic acid/methacrylamide copolymer Weight ratio = 59/15/26 Mw = 50,000 | 2.98 g |
| Infrared absorbing dye of Formula (3) | 0.41 g |
| Crystal Violet (manufactured by Hodogaya Kagaku Kogyo K.K.) | 0.09 g |
| BYK 307 (BYK Chemie) | 0.02 g |
| Fluorinated surfactant (30% methyl ethyl ketone solution) | 0.05 g |
| Methyl ethyl ketone | 53.55 g |
| Propylene glycol monomethyl ether | 18.57 g |
| γ-Butyrolactone | 7.00 g |
| Water | 7.00 g |

<Evaluation of Lithographic Printing Plate Precursor>

Using a CREO Trendsetter thermal exposure apparatus equipped with a laser having a wavelength of 830 nm and an output of 40 W, imagewise exposure of the lithographic printing plate precursors of Examples 1 to 15 and Comparative Examples 1 to 3 was conducted. Each of the exposed lithographic printing plate precursors was developed with a water diluted developing solution having the composition shown in Table 11 using PS processor PK-910 (manufactured by Dainippon Screen Mfg. Co., Ltd.). The development was conducted under the conditions of 30° C. for 12 seconds. The pH of the diluted developing solution was from 10.7 to 10.0. A finishing gum PF-2 (manufactured by Kodak Polychrome Graphics Japan Ltd.) was used as a finishing liquid.

TABLE 11

| Composition of Developing Solution | |
|---|---|
| Components | Amount |
| Water | 72.64 g |
| Monoethanolamine | 0.66 g |
| Diethanolamine | 3.45 g |
| Pelex NBL (aqueous 35% solution, manufactured by Kao Corporation) | 17.72 g |
| Benzyl alcohol | 5.53 g |

<Development Latitude>

A lithographic printing plate precursor was exposed at a rate of 120 mJ/cm$^2$ and then developed with developing solutions each having a different dilution rate. Developability of the laser exposed area and the state of the image area were evaluated. Development latitude was evaluated by the range of the dilution rate which exhibits good image properties. Optimum dilution rate of the developing solution is present in the center of the development latitude width.

<Scratch Resistance>

While applying a load using a scratching testing machine equipped with a sapphire needle having a diameter of 1.0 mm, a surface of a lithographic printing plate precursor was scratched. After the plate was developed with an optimum developing solution, a maximum load value at which no scratch was formed at the scratching portion was determined.

<Ink Receptivity>

A lithographic printing plate precursor was exposed at a rate of 120 mJ/cm$^2$ and then developed with an optimum developing solution. The lithographic printing plate thus obtained was mounted to a printing press Roland R-201 and then ink receptivity was evaluated.

<Print Run Length>

A lithographic printing plate precursor was exposed at a rate of 120 mJ/cm² and then developed with an optimum developing solution. The lithographic printing plate thus obtained was mounted to a printing press Roland R-201 and then print run length was evaluated.

The evaluation results of development latitude, scratch resistance, ink receptivity, and print run length are shown in Table 12.

TABLE 12

Evaluation Results
<Example in which Image Forming Layer is composed of Two Layers>

| | Resin of upper layer | Development latitude | Scratch resistance (g) | Ink receptivity (number of printed sheets) | Print run length (number of printed sheets) |
|---|---|---|---|---|---|
| Example 1 of the present invention | Polyurethane 1 | 1:4-1:7 | 6 | 5 | 180,000 |
| Example 2 of the present invention | Polyurethane 2 | 1:5-1:8 | 5 | 5 | 170,000 |
| Example 3 of the present invention | Polyurethane 3 | 1:4.5-1:7.5 | 6 | 5 | 170,000 |
| Example 4 of the present invention | Polyurethane 4 | 1:4.5-1:7.5 | 5 | 5 | 180,000 |
| Example 5 of the present invention | Polyurethane 5 | 1:4-1:7 | 6 | 5 | 180,000 |
| Example 6 of the present invention | Polyurethane 6 | 1:3.5-1:6.5 | 6 | 4 | 190,000 |
| Example 7 of the present invention | Polyurethane 7 | 1:3.5-1:6.5 | 6 | 4 | 200,000 |
| Example 8 of the present invention | Polyurethane 8 | 1:4-1:7 | 6 | 4 | 180,000 |
| Example 9 of the present invention | Polyurethane 9 | 1:4.5-1:7 | 5 | 5 | 180,000 |
| Example 10 of the present invention | Polyurethane 10 and Polyurethane 11 | 1:4-1:7 | 5 | 5 | 180,000 |
| Example 11 of the present invention | Polyurethane 1 | 1:3.5-1:6.5 | 6 | 4 | 180,000 |
| Example 12 of the present invention | Polyurethane 2 | 1:4.5-1:7.5 | 5 | 5 | 170,000 |
| Example 13 of the present invention | Polyurethane 3 | 1:4-1:7 | 6 | 5 | 180,000 |
| Example 14 of the present invention | Polyurethane 1 and ammonia-modified compound of styrene/maleic anhydride copolymer (Molecular ratio of styrene:maleic anhydride = 3:1, Molecular weight: 10,000) | 1:4.5-1:7.5 | 6 | 5 | 180,000 |
| Example 15 of the present invention | Polyurethane 1 and ammonia-modified compound of styrene/maleic anhydride copolymer (Molecular ratio of styrene:maleic anhydride = 3:1, Molecular weight: 10,000) | 1:4.5-1:7.5 | 6 | 4 | 190,000 |
| Comparative Example 1 | Polyurethane 11 | 1:4-1:6.5 | 3 | 10 | 180,000 |
| Comparative Example 2 | Novolac | (1:3-1:4)* | — | — | — |
| Comparative Example 3 | None | Only 1:8 | 1 | >100 | 110,000 |

*Evaluation could not be performed because of being insoluble in a developing solution.

TABLE 13

Evaluation Results
<Example in which Image Forming Layer is a single layer>

| | Resin | Development latitude | Scratch resistance (g) | Ink receptivity (number of printed sheets) | Print run length (number of printed sheets) |
|---|---|---|---|---|---|
| Example 16 of the present invention | Polyurethane | 1:3-1:5.5 | 4 | 7 | 150,000 |
| Example 17 of the present invention | Polyurethane 1+ | 1:3.5-1:6 | 4 | 7 | 160,000 |

As is apparent from the results shown in Table 12 and Table 13, the lithographic printing plate precursors of Examples 1 to 17 exhibit satisfactory developability using a developing solution having the pH of 12 or lower, and also have satisfactory scratch resistance, satisfactory inking property, and long print run length, as compared with the lithographic printing plate precursors of Comparative Examples 1 to 3.

The invention claimed is:

1. A positive-working lithographic printing plate precursor comprising a substrate having thereon an image forming layer comprising a water-insoluble and alkali-soluble or alkali-dispersible resin in an aqueous alkali solution,
wherein the image forming layer comprises at least a lower layer and an upper layer, and
the resin of one of the lower layer and the upper layer, or both of the lower layer and the upper layer comprises a polyurethane comprising:
a recurring unit comprising a substituent having an acidic hydrogen atom, which substituent is selected from the group consisting of a carboxyl group, a —SO$_2$NHCOO— group, a —CONHSO$_2$— group, a —CONHSO$_2$NH— group, and a —NHCONHSO$_2$— group, and
a recurring unit represented by the following general formula:

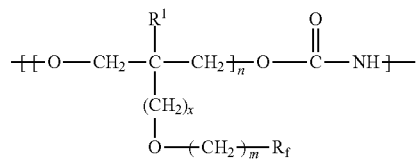

wherein
R$_f$ is an alkyl or polyether group in which at least 50% of hydrogen atoms have been fluorinated,
R$^1$ is a hydrogen atom, or a substituted or non-substituted alkyl group,
m is 0 or 1 to 10, n is 1 to 30, and
x is 1 to 4.

2. The positive-working lithographic printing plate precursor according to claim 1, wherein the recurring unit represented by general formula is derived from a diol and the recurring unit comprising the acidic hydrogen atom is derived from another.

3. The positive-working lithographic printing plate precursor according to claim 1, wherein
at least 75% of R$_f$ in the general formula is fluorinated, and R$^1$ is an alkyl group having 1 to 4 carbon atoms, m is 0, 1, 2, or 3, and x is 1 or 2.

4. The positive-working lithographic printing plate precursor according to claim 1, wherein the upper layer comprises the polyurethane.

5. The positive-working lithographic printing plate precursor according to claim 4, wherein the amount of the polyurethane contained in the upper layer is from 10% to 90% based on the total dry weight of the upper layer.

6. The positive-working lithographic printing plate precursor according to claim 1, wherein one of the lower layer and the upper layer, or both of the lower layer and the upper layer comprise(s) a photothermal conversion material.

7. The positive-working lithographic printing plate precursor according to claim 6, wherein the upper layer comprises a photothermal conversion material.

8. A positive-working lithographic printing plate precursor comprising a substrate having thereon an image forming layer comprising a water-insoluble and alkali-soluble or alkali-dispersible resin in an aqueous alkali solution,
wherein the positive-working lithographic printing plate precursor further comprises a photothermal conversion material, and
a resin, which is water-insoluble and alkali-soluble or alkali-dispersible in the aqueous alkali solution, and comprises a polyurethane comprising:
a recurring unit comprising a substituent having an acidic hydrogen atom, which substituent is selected from the group consisting of a carboxyl group, a —SO$_2$NHCOO— group, a —CONHSO$_2$— group, a —CONHSO$_2$NH— group, and a —NHCONHSO$_2$— group, and
a recurring unit represented by the following general formula:

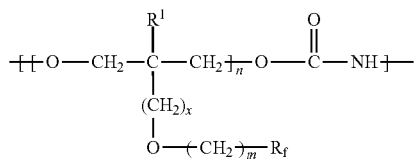

wherein
R$_f$ is a fluorinated alkyl or polyether group in which at least 50% of hydrogen atoms have been fluorinated,
R$^1$ is a hydrogen atom, or a substituted or non-substituted alkyl group,
m is 0 or 1 to 10, n is 1 to 30, and
x is 1 to 4.

9. A method for producing a lithographic printing plate, which comprises the steps of:
imagewisely exposing the positive-working lithographic printing plate precursor according to claim 1 using infrared rays to form exposed areas; and
developing the exposed positive-working lithographic printing plate precursor with an alkali developing solution to remove the image forming layer in the exposed areas, and thus forming image areas and non-image areas.

10. The method for producing a lithographic printing plate according to claim 9, wherein the alkali developing solution has pH of 12 or less.

11. The method for producing a lithographic printing plate according to claim 9, wherein the alkali developing solution comprises an organic solvent in the amount of 20% or less based on the total mass of the developing solution.

12. The method for producing a lithographic printing plate according to claim 9, wherein the alkali developing solution substantially comprises no silicate.

13. The positive-working lithographic printing plate precursor of claim 1, wherein the lower layer further comprises the water-insoluble and alkali-soluble or alkali-dispersible resin that can be produced by polymerizing a monomer mixture comprising one or more ethylenically unsaturated monomers having functional groups selected from a hydroxyl group, a carboxyl group, a sulfonic acid group, a phosphoric acid group, an imide groups, an amide group, and a combinations thereof.

14. The positive-working lithographic printing plate precursor of claim 1, wherein the water-insoluble and alkali-soluble or alkali-dispersible resin comprises recurring units that are derived from at least one ethylenically unsaturated monomer represented by the following

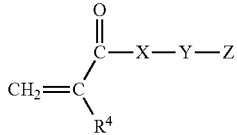
[Chemical Formula 6]

wherein:
- $R^4$ is a hydrogen atom, a $C_{1-22}$ linear, branched or cyclic alkyl group, a $C_{1-22}$ linear, branched or cyclic substituted alkyl group, a $C_{6-24}$ aryl group, or a substituted aryl group, and the substituent is selected from a $C_{1-4}$ alkyl group, an aryl group, a halogen atom, a keto group, an ester group, an alkoxy group, or a cyano group;
- X is O, S, and $NR^5$, in which $R^5$ is hydrogen, a $C_{1-22}$ linear, branched or cyclic alkyl group, a $C_{1-22}$ linear, branched or cyclic substituted alkyl group, a $C_{6-24}$ aryl group, or a substituted aryl group, and substituent is selected from a $C_{1-4}$ alkyl group, an aryl group, a halogen atom, a keto group, an ester group, an alkoxy group, or a cyano group;
- Y is a single bond, or $C_{1-22}$ linear, branched or cyclic alkylene, alkyleneoxyalkylene, poly(alkyleneoxy)alkylene, or alkylene-NHCONH—; and
- Z is a hydrogen atom, a hydroxy group, carboxylic acid, —$C_6H_4$—$SO_2NH_2$, —$C_6H_3$—$SO_2NH_2$(—OH), or a group represented by the following

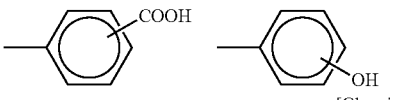
[Chemical Formula 7]

[Chemical Formula 8]

or a mixture thereof.

15. The positive-working lithographic printing plate precursor of claim 1, wherein the water-insoluble and alkali-soluble or alkali-dispersible resin comprises recurring units that are derived from a (meth)acrylic acid ester, (meth)acrylamide, maleimide, or (meth)acrylonitrile.

16. The positive-working lithographic printing plate precursor of claim 1, wherein the polyurethane has a molecular weight of from 2,000 to 100,000.

* * * * *